US011270870B2

(12) United States Patent
Duan et al.

(10) Patent No.: US 11,270,870 B2
(45) Date of Patent: Mar. 8, 2022

(54) PROCESSING EQUIPMENT COMPONENT PLATING

(71) Applicant: Applied Materials, Inc., Santa Clara, CA (US)

(72) Inventors: Ren-Guan Duan, Fremont, CA (US); Juan Carlos Rocha-Alvarez, San Carlos, CA (US); Bushra Afzal, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/806,852

(22) Filed: Mar. 2, 2020

(65) Prior Publication Data

US 2020/0321197 A1    Oct. 8, 2020

Related U.S. Application Data

(60) Provisional application No. 62/828,325, filed on Apr. 2, 2019.

(51) Int. Cl.
*C25D 7/00* (2006.01)
*H01J 37/32* (2006.01)
(Continued)

(52) U.S. Cl.
CPC .......... *H01J 37/32495* (2013.01); *C25D 3/48* (2013.01); *C25D 3/62* (2013.01);
(Continued)

(58) Field of Classification Search
None
See application file for complete search history.

(56) References Cited

U.S. PATENT DOCUMENTS 4,411,965 A * 10/1983 Rosegren .................. C25D 3/12
                                                              205/181
6,565,732 B1 * 5/2003 Kitada ...................... C25D 3/48
                                                              205/267
(Continued)

FOREIGN PATENT DOCUMENTS

KR    10-2010-0122901 A    11/2010

OTHER PUBLICATIONS

Dennis et al. "Nickel and chromium plating"second edition 1986. (Year: 1986).*

(Continued)

*Primary Examiner* — Wojciech Haske
(74) *Attorney, Agent, or Firm* — Patterson + Sheridan, LLP (57) ABSTRACT

A method of forming a radio frequency (RF) strap for use in a process chamber is provided. The method includes positioning a core strap including a first material that is electrically and thermally conductive in a first electrochemical bath. The first electrochemical bath includes a first solvent and a first plating precursor. The method further includes forming a first protective coating on an outer surface of the core strap, removing the first solvent and the first plating precursor from the core strap having the first protective coating formed thereon, post-treating the core strap having the first protective coating formed thereon, positioning the core strap having the first protective coating formed thereon in a second electrochemical bath, and forming a second protective coating on an outer surface of the first protective coating. The first protective coating includes nickel, the second electrochemical bath includes a second solvent and a second plating precursor, and the second protective coating includes gold.

16 Claims, 4 Drawing Sheets

(51) Int. Cl.
  *H01J 9/24*   (2006.01)
  *C25D 5/12*   (2006.01)
  *C25D 3/62*   (2006.01)
  *C25D 3/48*   (2006.01)

(52) U.S. Cl.
  CPC ............... *C25D 5/12* (2013.01); *C25D 7/00* (2013.01); *H01J 9/245* (2013.01); *H01J 37/32082* (2013.01); *H01J 37/32467* (2013.01); *H01J 37/32807* (2013.01); *H01J 2237/3321* (2013.01)

(56) References Cited

U.S. PATENT DOCUMENTS

| | | | |
|---|---|---|---|
| 7,534,301 | B2 | 5/2009 | White et al. |
| 2006/0159949 | A1* | 7/2006 | Yoo .......................... C25D 5/12 428/680 |
| 2008/0187682 | A1 | 8/2008 | Park et al. |
| 2010/0186993 | A1* | 7/2010 | Yamaguchi ........... B32B 15/018 174/126.2 |
| 2012/0222892 | A1* | 9/2012 | Sun ......................... H01L 24/48 174/257 |
| 2013/0126206 | A1 | 5/2013 | Zhou et al. |
| 2014/0045352 | A1* | 2/2014 | Weber .................... C25D 5/627 439/78 |
| 2015/0053135 | A1 | 2/2015 | Chung et al. |

OTHER PUBLICATIONS

Search Report dated Jul. 1, 2020 for Application No. PCT/US2020/020814.

* cited by examiner

PROCESSING EQUIPMENT COMPONENT PLATING

CROSS-REFERENCE TO RELATED APPLICATIONS

This application claims the benefit to U.S. provisional application No. 62/828,325, filed Apr. 2, 2019, which is incorporated by reference herein.

BACKGROUND

Field

Embodiments described herein generally relate to plating of components in semiconductor processing apparatuses that utilize high frequency power devices and, more particularly, to plating of a wide radio frequency (RF) ground strap used in semiconductor processing apparatuses with nickel and gold.

Description of the Related Art

Semiconductor processing apparatuses typically include a process chamber that is adapted to perform various deposition, etching or thermal processing steps on a wafer, or substrate, within a processing region of the process chamber. To achieve higher deposition rates in a typical plasma-enhanced chemical vapor deposition (PECVD) chamber, plasma density is increased by the application of an increased radio frequency (RF) power. The RF power is applied to a gas distribution plate of the chamber from an RF generator while a substrate pedestal, over which a wafer is disposed, is grounded such that the delivered RF power activates plasma within the processing region of the process chamber. As a wafer size increases, an area of the substrate pedestal that needs to be grounded increases. The use of a wide RF ground strap coupled to the substrate pedestal increases a ground path between the substrate pedestal and the chamber body, and thus correspondingly increases the effectiveness of grounding. The wide RE ground strap typically includes a base material made of copper alloy or pure copper, for example, and a protective coating on the base material with metal such as nickel (Ni), gold (Au), or silver (Ag) that provides a corrosion-resistant and electrically conductive layer on the base material. However, an increased RF current induced by the increased RF power in harsh plasma environment may cause peeling off and/or cracking of the protective coating. Furthermore, copper and/or nickel atoms that are diffused out may form oxide layers. These failures may subsequently reduce deposition rate rates in a PECVD chamber. Accordingly, there is a need in the art to improve processes of forming a protective coating and to provide an improved composition/structure of a robust protective coating.

SUMMARY

One or more embodiments described herein provide a method of forming an RF strap for use in a process chamber. The method includes positioning a core strap including a first material that is electrically and thermally conductive in a first electrochemical bath. The first electrochemical bath includes a first solvent and a first plating precursor. The method further includes forming a first protective coating on an outer surface of the core strap, removing the first solvent and the first plating precursor from the core strap having the first protective coating formed thereon, post-treating the core strap having the first protective coating formed thereon, positioning the core strap having the first protective coating formed thereon in a second electrochemical bath, and forming a second protective coating on an outer surface of the first protective coating. The first protective coating includes nickel, the second electrochemical bath includes a second solvent and a second plating precursor, and the second protective coating includes gold.

In one embodiment, an RF strap for use in a process chamber includes a core strap including a first material that is electrically and thermally conductive, a first protective coating on an outer surface of the core strap, and a second protective coating on an outer surface of the first protective coating. The first protective coating includes nickel and has a thickness of between 0.5 µm and 5 µm, and the second protective coating includes gold and has a thickness of between 10 µm and 50 µm.

In another embodiment, a process chamber includes a chamber body including a chamber bottom, a sidewall having a slit valve, and a substrate pedestal comprising a support body disposed in the chamber body. The process chamber further includes a wide RF ground strap having a first end coupled with the support body and a second end coupled with the chamber bottom. The wide FR ground strap includes a core strap comprising a first material that is electrically and thermally conductive, a first protective coating on an outer surface of the core strap, and a second protective coating on an outer surface of the first protective coating. The first protective coating comprises nickel and has a thickness of between 0.5 µm and 5 µm, and the second protective coating comprises gold and has a thickness of between 10 µm and 50 µm.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

Embodiments described herein generally relate to radio frequency (RF) straps that are adapted to perform high RF power processes on a wafer, or substrate, disposed in a processing region of a semiconductor processing chamber. An RF strap includes a dual protective coating that has optimized structure and thickness such that peeling and/or melting of the dual protective coating may be avoided. Embodiments described herein also relate to methods for forming the dual protective coating with optimized structure and thickness.

Figure 1:
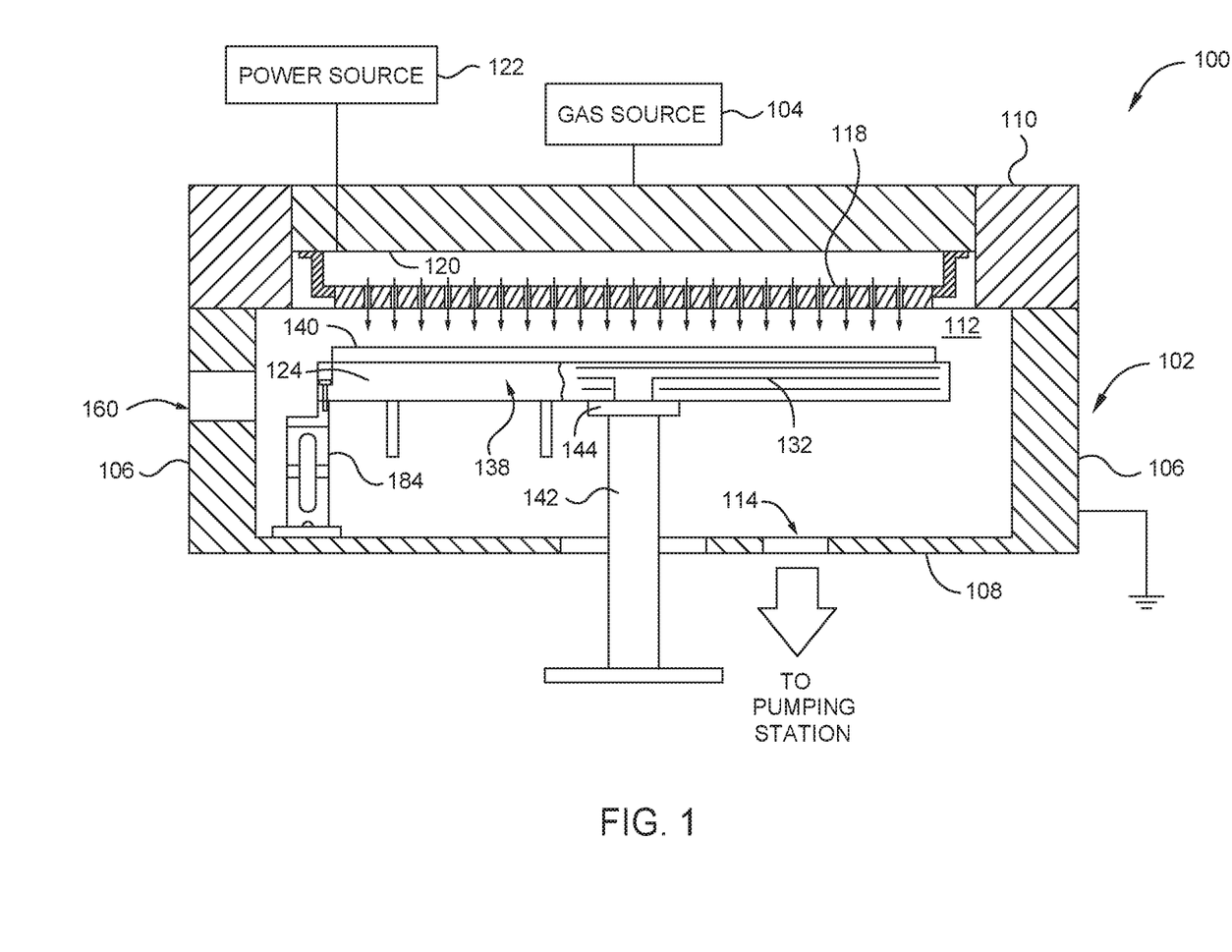
FIG. 1 is a schematic view of a plasma enhanced chemical vapor deposition (PECVD) system according to one embodiment.

FIG. 1 is a schematic view of a plasma enhanced chemical vapor deposition (PECVD) system 100 according to one embodiment. In the PECVD system 100, a chamber body 102 is coupled to a gas source 104 and has sidewalls 106, a bottom 108, and a lid assembly 110 that define a process volume 112. The process volume 112 may be accessed through a slit valve 160 on the sidewall 106 that allows movement of a substrate 140 into and out of the chamber body 102. The sidewalls 106 and the bottom 108 of the chamber body 102 may be fabricated from aluminum or other material compatible with process chemistries. The bottom 108 of the chamber body 102 has a pumping port 114 formed therethrough that couples the process volume 112 to a pumping system (not shown) for controlling pressure within the process volume 112 and exhaust gases and byproducts during processing.

The lid assembly 110 is supported by the sidewalls 106 and may be removed to service the interior of the chamber body 102. The lid assembly 110 may be fabricated from aluminum. A gas distribution plate 118 is coupled to an interior side 120 of the lid assembly 110. The gas distribution plate 118 may be fabricated from aluminum. A middle section of the gas distribution plate 118 includes a perforated area through which process and other gases supplied from the gas source 104 are delivered to the process volume 112. The perforated area of the gas distribution plate 118 is configured to provide a uniform distribution of gases passing through the gas distribution plate 118 into the chamber body 102. A power source 122 is coupled to the gas distribution plate 118 to apply an electrical bias voltage that energizes the process gas and sustains plasma formed from process gas in the process volume 112 below the gas distribution plate 118 during processing.

A substrate pedestal 138 is centrally disposed within the chamber body 102 and supports the substrate 140 during processing. The substrate pedestal 138 may include an electrically conductive support body 124 supported by a shaft 142 that extends through the bottom 108 of the chamber body 102. The support body 124 is covered with an electrically insulating coating (not shown) over at least the portion of the support body 124 that supports the substrate 140. The coating may also cover other portions of the support body 124. The substrate pedestal 138 is coupled to ground at least during processing.

In some embodiments, the support body 124 includes at least one embedded heating element 132. The heating element 132, such as an electrode or resistive element, is coupled to a power source (not shown) and controllably heats the substrate pedestal 138 and substrate 140 positioned thereon to a predetermined temperature. The heating element 132 maintains the substrate 140 at a uniform temperature of between about 150° C. and about 460° C. during processing. The heating element 132 is electrically floating relative to the support body 124.

The shaft 142 provides a conduit for electrical and thermocouple leads between the substrate pedestal 138 and other components of the PECVD system 100. The shaft 142 may be electrically isolated from the chamber body 102. The substrate pedestal 138 is grounded during processing such that an RF power supplied by the power source 122 to the gas distribution plate 118 (or other electrode positioned within or near the lid assembly 110 of the chamber body 102) may excite the gases disposed within the process volume 112 between the substrate pedestal 138 and the gas distribution plate 118.

The PECVD system 100 further includes a wide RF ground strap 184. The substrate 140 may have a plan surface area greater than about 2,500 cm$^2$. The use of the wide RF ground strap 184 contributes to the effectiveness of a ground path coupled between the substrate pedestal 138 and the chamber body 102.

Figure 2A:
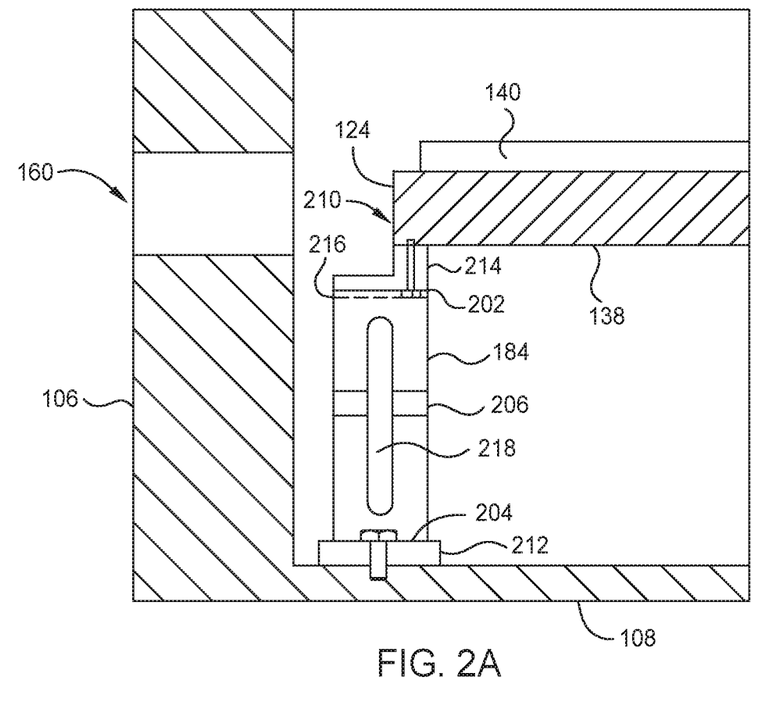
FIG. 2A is an enlarged view of a PECVD system having a wide RF ground strap according one embodiment.

FIG. 2A is an enlarged view of the PECVD system 100 having the wide RF ground strap 184 according one embodiment. The wide RF ground strap 184 provides an RF current return path between the substrate pedestal 138 and the chamber body 102. The wide RF ground strap 184 has a first end 202, a second end 204, and at least one bend 206. The first end 202 of the wide RF ground strap 184 is electrically coupled to the support body 124 of the substrate pedestal 138 via a connection assembly 210. The second end 204 of the wide RF ground strap 184 is electrically coupled to the bottom 108 of the chamber body 102 by a bottom clamp 212. The wide RF ground strap 184 may be coupled to the support body 124 of the substrate pedestal 138 via other means such as, for example, fasteners or other methods that maintain electrical connection between the support body 124 of the substrate pedestal 138 and the wide RF ground strap 184. The connection assembly 210 extends outward from and perpendicular to the perimeter of the support body 124. The connection assembly 210 comprises a top piece 214 and a bottom piece 216. Alternatively, adhesives, clamps or other methods that maintain electrical connection between the chamber body 102 and the wide RF ground strap 184 may be utilized to attach the wide RF ground strap 184 to the bottom 108 of the chamber body 102 and/or the substrate pedestal 138. The wide RF ground strap 184 may further include a slot 218 extending through the bend 206. The slot 218 helps increase the flexibility of the wide RF ground strap 184.

Figure 2B:
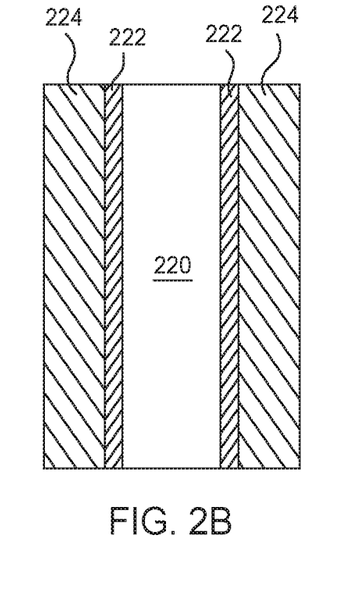
FIG. 2B is a cross-sectional view of a wide RF ground strap according to one embodiment.

FIG. 2B is a cross-sectional view of the wide RF ground strap 184. As shown, the wide RF ground strap 184 includes a core strap 220 made of copper beryllium (BeCu) such as Alloy 25 or copper (Cu) such as C101. Copper beryllium alloy provides high tensile strength, high fatigue strength, high resistance to wear, corrosion, galling, and stress relaxation, and high electrical and thermal conductivity and is often used for connectors and components in heavy-duty applications in harsh environments. Copper C101 is a 99.99% pure copper having a 0.0005% oxygen content, and is often used for wire and cable, integrated circuits circuit boards, and conductors due to high electrical and thermal conductivity. The wide RF ground strap 184 further includes a first protective coating 222 on an outer surface of the core strap 220, and a second protective coating 224 on an outer surface of the first protective coating 222. The second protective coating 224 may be made of gold (Au) that provides corrosion resistance and electrical conductivity.

The first protective coating 222 may be inserted between the core strap 220 and the second protective coating 224 as a barrier layer that prevents diffusion of copper atoms from the core strap 220 through pores of the second protective coating 224, which causes tarnishing of the outer surface of the core strap 220 and formation of an oxide and/or phosphide layer therein. The first protective coating 222 may be made of nickel (Ni), which reduces the pores of the second protective coating 224 and further increases corrosion resistance. The first protective coating 222 may have a thickness between about 0.5 micrometer (μm) and about 5 μm, such as about 2 μm. The second protective coating 224 may have a thickness of between about 10 μm and about 50 μm, such as about 15 μm.

The RF current provided by the power source 122 flows primarily through an outer surface of the wide RF ground strap 184. A current carrying area of the wide RF ground strap 184 is an area within skin depth δ from the outer surface. Skin depth δ can be approximated as $\delta = \sqrt{\rho/\pi f \mu_r \mu_0}$, where ρ is the resistivity of the medium in Ω·m, f is the driving frequency in Hertz (Hz), $\mu_r$ is the relative permittivity of the material, and $\mu_0$ is the permittivity of free space. Skin depths of gold, nickel, and copper are approximately 20.5 μm, 1.46 μm, and 17.7 μm, respectively, at the driving frequency of 13.56 MHz. Thus, in an example where the core strap 220 has an outer diameter of 6 mm, the first protective coating 222 has a thickness of 2 μm, the second protective coating 224 has a thickness of 15 μm, and the driving frequency is 13.56 MHz, the RF current provided by the power source 122 flows primarily through the second protective coating 224. Skin depth of nickel is shorter compared to gold, and thus the first protective coating 222 made of nickel may be formed thick enough to act as the barrier layer and thin enough not to decrease conductivity of the wide RF ground strap 184.

The first and second protective coatings 222, 224 may be deposited either by an electroplating or an electroless plating process. In an electroplating process, the core strap 220 may be immersed in an electrolyte solution containing dissolved ions of gold or nickel and an introduction of an electrical current due to a constant direct current (DC) bias voltage or pulsed bias voltage stimulates a reaction that deposits gold or nickel onto the outer surface of the core strap 220. In an electroless plating process, the core strap 220 may be immersed in a liquid plating solution and gold or nickel may be deposited onto the outer surface of the core strap 220 via an autocatalytic reaction without requiring a constant DC bias voltage or pulsed bias voltage. In the methods described below, the first and second protective coatings 222, 224 are deposited by electroplating processes.

Figure 3:
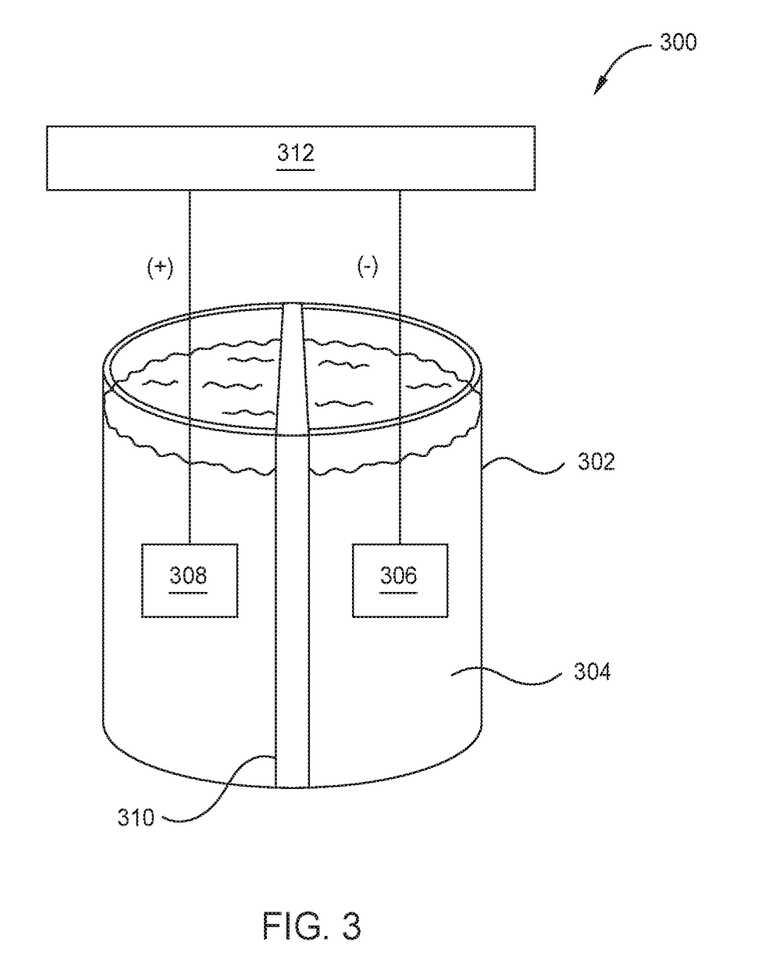
FIG. 3 is a schematic view of an electrochemical bath according to one embodiment.
Figure 4:
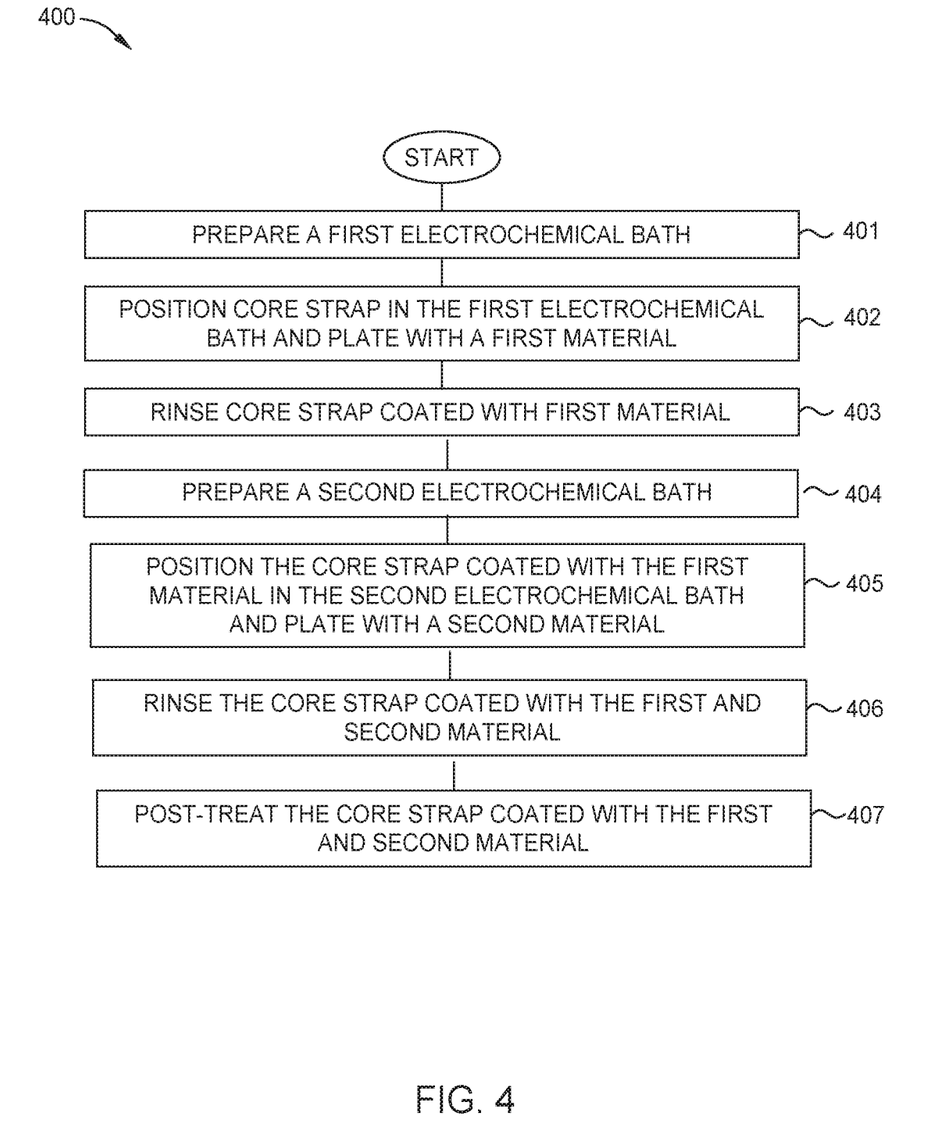
FIG. 4 is a flow diagram of a method for electroplating a core strap according to one embodiment.

FIG. 3 is a schematic view of an electrochemical bath 300 according to one embodiment. FIG. 4 is a flow diagram of a method 400 for electroplating the core strap 220 according to one embodiment. FIGS. 3 and 4 will be explained in conjunction to facilitate explanation of aspects of the disclosure. In the method 400 described below, two electrochemical baths (a first electrochemical bath and a second electrochemical bath) are used. Both the first and second chemical baths have the configuration of the electrochemical bath 300 described below, and thus may both be denoted by 300. The components of the first and second electrochemical baths are also denoted by the same reference numerals.

As shown in FIG. 3, the electrochemical bath 300 includes a container 302 having a solution 304 disposed therein. The solution 304 may include one or more solvents, a plating precursor, and plating additives. The plating precursor and the plating additives may be dissolved in the one or more solvents. The one or more solvents in the solution 304 may be aqueous solvents such as deionization (DI) water, or non-aqueous solvents such as diethyl ether, dry acetonitrile, ethanol, toluene, or isopropyl alcohol or mixtures of two solvents in a ratio of between about 1:20 and about 1:5, such as about 1:2, about 1:3, about 1:4, or about 1:5. An anode 306 and a workpiece 308 to be plated, which functions as a cathode, are positioned in the solution 304 and may be separated by a divider 310, such as a porous membrane, for example, a perforated polyvinylidene difluoride (PVDF) sheet, to reduce the likelihood of physical contact between the anode 306 and the workpiece 308.

In some embodiments, the anode 306 is a soluble anode made of platinum (Pt) or other noble metal that is consumed during a plating process.

The anode 306 and the workpiece 308 are coupled to a power supply 312 that induces an electrical current between the anode 306 and the workpiece 308 by a constant DC bias voltage or pulsed bias voltage to facilitate plating of material onto the workpiece 308. The anode 306 is negatively biased by the power supply 312, while the workpiece 308 is positively biased by the power supply 312. The anode 306 and the workpiece 308 may be biased with a constant DC voltage of between about 1 volt and about 300 volts or between about 1 volt and about 100 volts, such as about between 1 volt and about 50 volts, or between about 1 volt and about 10 volts.

Additionally or alternatively, the bias voltages may be applied in pulses altered rapidly between two different values. The rapid alternation results in a series of pulses of equal amplitude, duration, and polarity, separated by zero current. Each pulse consists of an ON time ($T_{ON}$) and OFF time ($T_{OFF}$). During $T_{OFF}$, dissolved ions migrate to depleted areas in the electrochemical bath 300, and thus during $T_{ON}$, more evenly-distributed ions are available for deposition onto the workpiece 308. In one example, $T_{ON}$ may be between about 0.001 seconds and about 60 seconds, and $T_{OFF}$ time may be between about 0.001 seconds and 60 seconds.

The method 400 begins at block 401. In block 401, the first electrochemical bath 300 is prepared for electroplating the core strap 220 with a first material, such as nickel, to form the first protective coating 222. The workpiece 308 corresponds to the core strap 220 in block 401. In some embodiments, the plating precursor is nickel sulfamate 4-hydrate ($Ni(SO_3NH_2)_2$) and is dissolved a solvent (e.g., DI water) in the solution 304 at a concentration of between about 350 gram per liter (g/L) and about 450 g/L, such as about 350 g/L. Nickel sulfamate dissociates in the solution 304 into $Ni^{2+}$ and sulfamate $(SO_3NH_2)^{2-}$ ions. The $Ni^{2+}$ ions are reduced to nickel (Ni) and deposited onto the outer surface of the workpiece 308 (the core strap 220). The sulfamate $(SO_3NH_2)^{2-}$ ions migrate to the anode 306 and form a sulfamate layer by consuming the anode 306, which is dissolved in the solution 304. Nickel sulfamate has a high solubility in aqueous solvents, and thus provides high current densities between the anode 306 and the workpiece 308 (the core strap 220) leading to high deposition rates. In addition, deposited nickel (Ni) layers provide improved surface uniformity and improved mechanical properties.

One or more additives, such as nickel chloride as hexahydrate ($NiCl_2 \cdot (H_2O)_6$), may be added to the solution 304 to improve deposition processes and characteristics of the first protective coating 222. The additive nickel chloride may be present in the solution 304 at a concentration less than about 30 g/L, such as about 20 g/L and improve the conductivity of the solution and solubility of the anode 306, thereby increasing deposition rate of nickel and improving deposition uniformity. One or more buffering agents, such as boric acid ($H_3BO_3$), may be added to the solution 304 at a concentration of between about 30 g/L and about 45 g/L, such as about 35 g/L, to control acidity (a pH level) of the solution 304.

In block 402, the workpiece 308 (the core strap 220) may be positioned in the solution 304 such that the workpiece 308 (the core strap 220) is plated with the first material, such as nickel. In some embodiments, the anode 306 and the workpiece 308 (the core strap 220) may be biased with a relatively low voltage of between about 1 volt and about 10 volts (corresponding to an electrical current density of between about 2 $A/dm^2$ and about 25 $A/dm^2$) when using the nickel sulfamate 4-hydrate plating precursor, due to the high conductivity of the nickel sulfamate electrolytes. The bias voltages in block 402 may be applied for a time period of between about 5 minutes and about 5 hours, such as about 10 minutes.

The solution 304 may be maintained at a temperature of between about 40° C. and 60° C., such as 50° C., during the plating process in block 402. The acidity of the solution 304 may be maintained between about a pH of 3.5 and about a pH of 4.5, such as 4.

The concentration of the plating precursor, the duration of the bias voltage, the magnitude of the bias voltage, or the like used in blocks 401 and 402 may be adjusted such that a thickness of the first protective coating 222 deposited onto the outer surface of the core strap 220 is between about 0.5 µm and about 5 µm, such as about 2 µm.

Subsequently, in block 403, the workpiece 308 (corresponding to the core strap 220 coated with the first protective coating 222 in block 403) is removed from the solution 304, and the outer surface of the first protective coating 222 is sprayed and rinsed with DI water.

In block 404, the second electrochemical bath 300 is prepared for electroplating the core strap 220 coated with the first protective coating 222 with a second material, such as gold, to form the second protective coating 224. The workpiece 308 corresponds to the core strap 220 coated with the first protective coating 222 in block 405. In some embodiments, the plating precursor is bis(1,2-ethanediamine) gold trichloride ([$Au(en)_2$]$Cl_3$, where ethanediamine (en) stands for $C_2H_4(NH_2)_2$) and dissolved a solvent (e.g., diethyl ether) in the solution 304 at a concentration of between about 5 g/L and about 20 g/L, such as about 10 g/L. Bis(1,2-ethanediamine) gold trichloride dissociates in the solution 304 into $Au(en)_2^{3+}$ and $Cl^-$ ions. When trivalent gold salt (having three valences) such as bis(1,2-ethanediamine) gold trichloride is used, the gold plating solution hardly deteriorates over a prolonged period of time and provides long-term stability. The stability of the gold plating solution can be further increased by the addition of 1,2-ethanediamine. The $Au(en)_2^{3+}$ ions are reduced to gold (Au) and deposited onto the outer surface of the workpiece 308 (the core strap 220 coated with the first protective coating 222). The chlorine $Cl^-$ ions migrate to the anode 306 and form a chloride layer by consuming the anode 306, which is dissolved in the solution 304.

One or more additives, such as 1,2-ethanediamine sulfate, may be added to the solution 304. The additive 1,2-ethanediamine sulfate may be present in the solution 304 at a concentration of between about 50 g/L and about 200 g/L, such as about 100 g/L and retain gold ions stably in the solvent.

One or more buffering agents, such as citric acid, acetic acid, succinic acid, lactic acid, tartaric acid, or the like may be added to the solution 304 at a concentration of between about 20 g/L and about 80 g/L, such as about 50 g/L, to control acidity of the solution 304.

In block 405, the workpiece 308 (the core strap 220 coated with the first protective coating 222) may be positioned in the solution 304 such that the workpiece 308 (the core strap 220 coated with the first protective coating 222) is plated with the second material, such as gold. In some embodiments, the anode 306 and the workpiece 308 (the core strap 220 coated with the first protective coating 222) may be biased with a voltage of between about 1 volt and about 100 volts (corresponding to an electrical current density of between about 0.5 $A/dm^2$ and about 10 $A/dm^2$, such as 3.5 $A/dm^2$) when using bis(1,2-ethanediamine) gold trichloride plating precursor. The anode 306 and the workpiece 308 (the core strap 220 coated with the first protective coating 222) may be biased with an electrical current density of between about 0.5 $A/dm^2$ and about 10 $A/dm^2$, such as 1.0 $A/dm^2$. The bias voltages in block 405 may be applied for a time period of between about 10 minutes and about 10 hours, such as about 1 hour.

The solution 304 may be maintained at a temperature of between about 15° C. and about 60° C., such as 60° C., during the plating process in block 405. The acidity of the solution 304 may be maintained between about a pH of 3 and about a pH of 4.5, such as a pH of 3.5.

The concentration of the plating precursor, the duration of the bias voltage, the magnitude of the bias voltage, or the like used in blocks 405 and 406 may be adjusted such that a thickness of the second protective coating 224 deposited onto the outer surface of the first protective coating 222 is between about 10 µm and about 50 µm, such as about 15 µm.

Subsequently, in block 406, the workpiece 308 (that is, the core strap 220 coated with the first and second protective coatings 222, 224) is removed from the solution 304, and the outer surface of the second protective coating 224 is sprayed and rinsed with DI water.

In block 407, after the outer surface of the second protective coating 224 is sprayed and rinsed with DI water, the workpiece 308 (the core strap 220 coated with the first and second protective coatings 222, 224) may be subjected to a post treatment process. In some embodiments, the post treatment process of block 407 is an annealing process, in which the workpiece 308 (the core strap 220 coated with the first and second protective coatings 222, 224) is annealed at a temperature of about 50° C. to about 320° C., for example, about 120° C., for duration between about half an hour and about 36 hours, for example about 4 hours. The anneal temperature may be selected to facilitate removal of hydroxyl moieties (i.e., hydroxyl functional group-OH) from the outer surface of the workpiece 308 (the core strap 220 coated with the first and second protective coatings 222, 224) during the post treatment process.

In the example embodiments described herein, RF straps that are adapted to perform high RF power processes on a wafer, or substrate, disposed in a processing region of a semiconductor processing chamber are shown. An RF strap includes a dual protective coating that has optimized structures and thickness such that peeling and/or melting of the dual protective coating may be avoided. Methods for forming the dual protective coating with optimized structures and thickness are also shown.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a radio frequency (RF) strap for use in a process chamber, comprising:
    positioning a core strap comprising a first material that is electrically and thermally conductive in a first electrochemical bath, the first electrochemical bath comprising a first solvent and a first plating precursor;
    forming a first protective coating having a thickness of between 0.5 μm and 5 μm on an outer surface of the core strap, the first protective coating comprising nickel, by introducing an electrical current due to a pulsed bias voltage in the first electrochemical bath;
    rinsing the core strap having the first protective coating formed thereon;
    positioning the core strap having the first protective coating formed thereon in a second electrochemical bath, the second electrochemical bath comprising a second solvent and a second plating precursor;
    forming a second protective coating having a thickness of between 10 μm and 50 μm on an outer surface of the first protective coating, the second protective coating comprising gold, by introducing an electrical current due to a pulsed bias voltage in the second electrochemical bath; and
    post-treating the core strap having the first and second protective coatings formed thereon.

2. The method according to claim 1, wherein the first material is selected from the group consisting of beryllium alloy and copper.

3. The method according to claim 1, wherein the first plating precursor comprises nickel sulfamate and the first solvent comprises deionization (DI) water.

4. The method according to claim 1, wherein the first plating precursor is dissolved in the first solvent at a concentration of between 350 gram per liter and 450 gram per liter.

5. The method according to claim 1, wherein the first electrochemical bath further comprises nickel chloride at a concentration less than 30 gram per liter.

6. The method according to claim 1, wherein the first electrochemical bath further comprises boric acid at a concentration between 30 gram per liter and 45 gram per liter.

7. The method according to claim 1, wherein the forming of the first protective coating is performed while an electrical current density in the first electrochemical bath is maintained at between 2 A/dm$^2$ and 25 A/dm$^2$ for a time period of between 5 minutes and 5 hours.

8. The method according to claim 1, wherein the forming of the first protective coating is performed while the first electrochemical bath is maintained at a temperature of between about 40° C. and 60° C.

9. The method according to claim 1, wherein the forming of the first protective coating is performed while the first electrochemical bath is maintained at a pH of between 3.5 and 4.5.

10. The method according to claim 1, wherein the second plating precursor is bis(1,2-ethanediamine) gold trichloride and the second solvent is diethyl ether.

11. The method according to claim 1, wherein the second plating precursor is dissolved in the second solvent at a concentration of between 5 gram per liter and 20 gram per liter.

12. The method according to claim 1, wherein the second electrochemical bath further comprises 1,2-ethanediamine sulfate at a concentration of between 50 gram per liter and 200 gram per liter.

13. The method according to claim 1, wherein the second electrochemical bath further comprises citric acid at a concentration between 20 gram per liter and 80 gram per liter.

14. The method according to claim 1, wherein the forming of the second protective coating is performed while an electrical current density in the second electrochemical bath is maintained at between 0.5 A/dm$^2$ and 10 A/dm$^2$ for a time period of between 10 minutes and 10 hours.

15. The method according to claim 1, wherein the forming of the second protective coating is performed while the second electrochemical bath is maintained at a temperature of between about 15° C. and 60° C.

16. The method according to claim 1, wherein the forming of the second protective coating is performed while the second electrochemical bath is maintained at a pH of between 3 and 4.5.

* * * * *